United States Patent
Balasubramanyam

(10) Patent No.: US 7,613,585 B1
(45) Date of Patent: Nov. 3, 2009

(54) METHOD AND SYSTEM FOR DEFINING MATERIAL PROPERTIES HIERARCHICALLY IN FINITE ELEMENT ANALYSIS

(75) Inventor: Subramani Balasubramanyam, Rochester Hills, MI (US)

(73) Assignee: Livermore Software Technology Corporation, Livermore, CA (US)

( * ) Notice: Subject to any disclaimer, the term of this patent is extended or adjusted under 35 U.S.C. 154(b) by 647 days.

(21) Appl. No.: 11/294,070

(22) Filed: Dec. 5, 2005

(51) Int. Cl.
*G06F 17/50* (2006.01)
*G06F 17/00* (2006.01)

(52) U.S. Cl. .................... 702/137; 702/33; 702/183; 703/1; 703/2; 703/6; 703/7

(58) Field of Classification Search ............ 702/137, 702/33, 34, 35, 42
See application file for complete search history.

(56) References Cited

U.S. PATENT DOCUMENTS

| | | | |
|---|---|---|---|
| 5,197,001 A * | 3/1993 | Mukherjee | 705/29 |
| 6,631,647 B2 * | 10/2003 | Seale | 73/789 |
| 6,704,664 B2 * | 3/2004 | Su et al. | 702/34 |
| 7,050,912 B2 * | 5/2006 | Bernhardi et al. | 702/42 |
| 2005/0159936 A1 * | 7/2005 | Rees et al. | 703/6 |

OTHER PUBLICATIONS

Gere and Timoshenko, Mechanics of Materials (Fourth Edition, 1977) pp. 1-35.
LS-DYNA User'S Manual Version 940 Jun. 1, 1997, pages for Material Property Definitions (*MAT), 11 pages.

* cited by examiner

*Primary Examiner*—Hal D Wachsman
(74) *Attorney, Agent, or Firm*—Roger H. Chu

(57) ABSTRACT

A system, method and software product for defining material properties hierarchically in a finite element analysis of a structure is disclosed. As a material type is created, the type is checked whether it is a root material type. If so, all of the material properties are defined explicitly in the current definition. Otherwise, the parent material type is searched and located first until the traversing finds a root definition. All of the material properties of the parent material type(s) found are read in and stored as the base properties of the material to be created. The material properties explicitly defined in the current definition of the material will either overwrite or add to the base properties. The material properties definition resembles a hierarchical tree: each of the material properties type has a parent material except the root material type which is on the top of the tree.

17 Claims, 5 Drawing Sheets

300

302 {
*MAT_GENERAL_DEFINITION_TITLE
Virgin Steel
100, 001, 0   — 304
E, 210000
305 — RHO, 7.89e-9,
306 — NU, 0.3

307 {
*MAT_GENERAL_DEFINTION_TITLE
Steel Perfectly Plastic
308 { 101, 003, 100
SIGY, 200

309 {
*MAT_GENERAL_DEFINTION_TITLE
Steel Bilinear Elastic-Plastic
310 { 102, 003, 101
ETAN, 1000

*MAT_GENERAL_DEFINTION_TITLE
Steel Rigid
103, 020, 100
312 { CMO, 1
CON1, 7
CON2, 7
*END

*FIG. 3*

METHOD AND SYSTEM FOR DEFINING MATERIAL PROPERTIES HIERARCHICALLY IN FINITE ELEMENT ANALYSIS

BACKGROUND OF THE INVENTION

1. Field of the Invention

The present invention generally relates to a method, system and software product used in three-dimensional non-linear finite element analysis of a structure, more particularly to definition of material properties hierarchically in finite element analysis.

2. Description of the Related Art

Finite element analysis (FEA) is a computerized method widely used in industry to model and solve engineering problems relating to complex systems such as three-dimensional non-linear structural design and analysis. FEA derives its name from the manner in which the geometry of the object under consideration is specified. With the advent of the modern digital computer, FEA has been implemented as FEA software. Basically, the FEA software is provided with a model of the geometric description and the associated material properties at each point within the model. In this model, the geometry of the system under analysis is represented by solids, shells and beams of various sizes, which are called elements. The vertices of the elements are referred to as nodes. The model is comprised of a finite number of elements, which are assigned a material name to associate with material properties. The model thus represents the physical space occupied by the object under analysis along with its immediate surroundings. The FEA software then refers to a table in which the properties (e.g., stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

FEA is becoming increasingly popular with automobile manufacturers for optimizing both the aerodynamic performance and structural integrity of vehicles. Similarly, aircraft manufacturers rely upon FEA to predict airplane performance long before the first prototype is built. Rational design of semiconductor electronic devices is possible with Finite Element Analysis of the electrodynamics, diffusion, and thermodynamics involved in this situation. FEA is utilized to characterize ocean currents and distribution of contaminants. FEA is being applied increasingly to analysis of the production and performance of such consumer goods as ovens, blenders, lighting facilities and many plastic products. In fact, FEA has been employed in as many diverse fields as can be brought to mind, including plastics mold design, modeling of nuclear reactors, analysis of the spot welding process, microwave antenna design, simulating of car crash and biomedical applications such as the design of prosthetic limbs. In short, FEA is utilized to expedite design, maximize productivity and efficiency, and optimize product performance in virtually every stratum of light and heavy industry. This often occurs long before the first prototype is ever developed.

One of the most challenging FEA tasks is to simulate an impact event such as car crash or metal forming. Finite element models representing the physical structure have become huge (e.g., more than 1,000,000 elements). There are many different types of materials for these elements. Each of the elements has one of the material types associated with. Traditional, each of the material types must be individually defined in the model, and there is no relationship between each of the material types. As a result, it is very difficult to keep track all of the material types of a finite element model in the traditional input method. When the model is growing larger, the same material type may be defined multiple times. In addition, many of the models have been prepared by more than one user or engineer. This creates even more repetitive redundant definitions of material type. It is therefore desirable to have new improved method and system for defining material properties in the finite element analysis.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

The present invention discloses a system, method and software product for defining material properties hierarchically in a finite element analysis of a structure is disclosed. According to one aspect, as a material type is created, the type is checked whether it is a root material type. If so, all of the material properties are defined explicitly in the current definition. Otherwise, the parent material type is searched and located first. All of the material properties of the parent material type are read in and stored as the base properties of the material to be created. The material properties explicitly defined in the current definition of the material will either overwrite or add to the base properties. The material properties definition resembles a hierarchical tree: each of the material properties type has a parent material except the root material type which is on the top of the hierarchical tree.

According to another aspect, the hierarchical material properties definition gives a easy visual representation and organization of ever increasing material properties definition. This technique can reduce redundancy and makes the material properties definition more manageable.

In one embodiment as a method for defining material properties hierarchically in finite element analysis of a structure, the method comprises: creating a label for the new material to be defined, when a new material is designated as a root, assigning an indicator to the new material being the root; reading and storing explicitly defined properties as the material properties of the new material, otherwise, locating parent of the new material; assigning an indicator to the new material identifying the parent; inheriting material properties of the parent as the material properties of the new material; and reading and storing explicit defined properties to overwrite and to add to the material properties of the new material.

In another embodiment as the method of the previous embodiment, the method further comprises: displaying the material definition as a hierarchical tree, wherein the root is located on the top of the hierarchical tree and the parent is located on a node of the hierarchical tree with other materials underneath.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIG. 3 shows an exemplary text view of a hierarchical material definition used in finite element analysis software in accordance with one embodiment of the present invention.

DETAILED DESCRIPTION OF THE PREFERRED EMBODIMENTS

Figure 1:
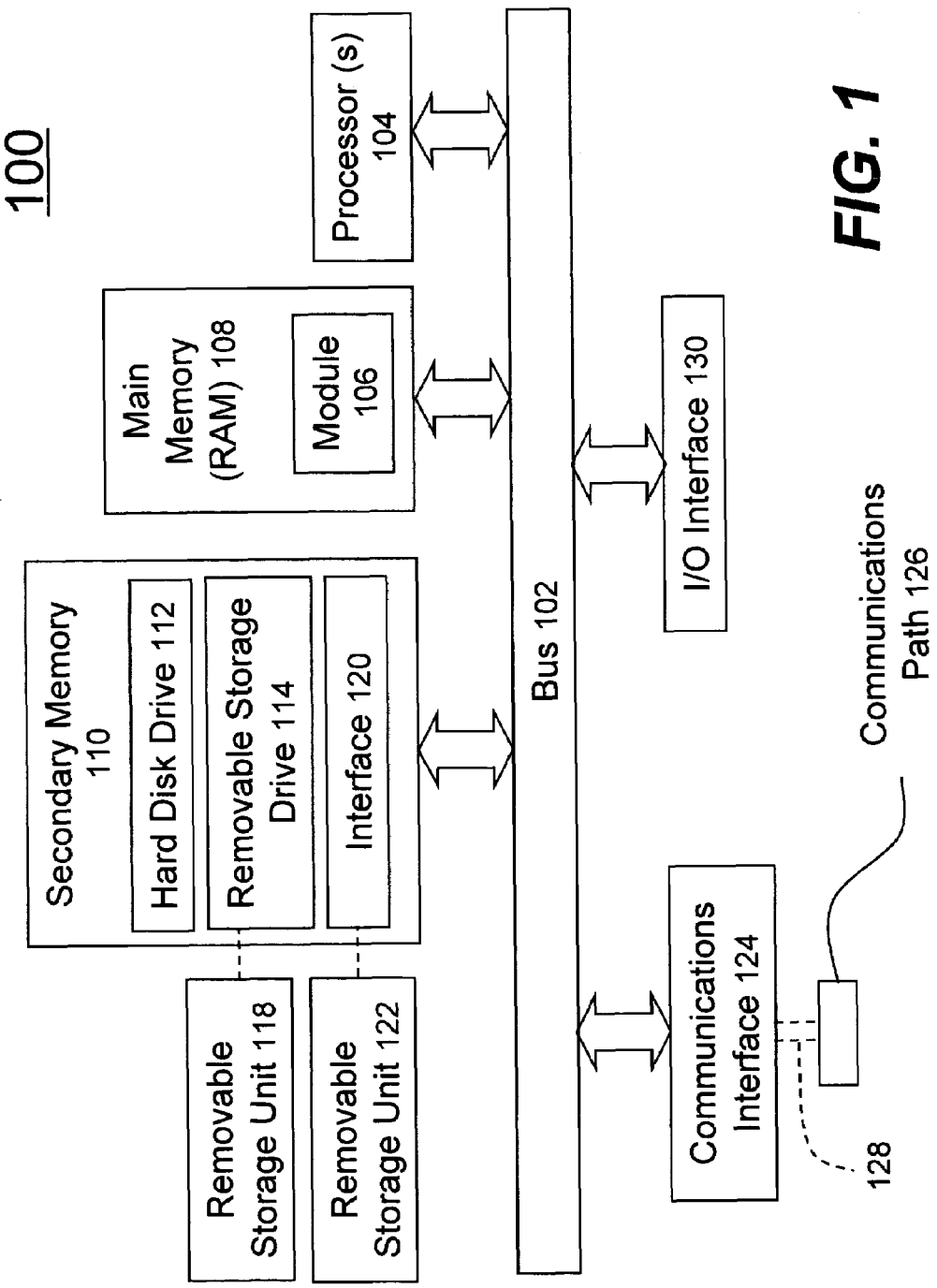
FIG. 1 depicts a block diagram of an exemplary computer, in which one embodiment of the present invention may be implemented.

The present invention discloses a system, method and software product for defining material properties hierarchically in a finite element analysis of a structure is disclosed. According to one aspect, as a material type is created, the type is checked whether it is a root material type. If so, all of the material properties are defined explicitly in the current definition. Otherwise, the parent material type is searched and located first. All of the material properties of the parent material type are read in and stored as the base properties of the material to be created. The material properties explicitly defined in the current definition of the material will either overwrite or add to the base properties. The material properties definition resembles a hierarchical tree: each of the material properties type has a parent material except the root material type which is on the top of the hierarchical tree.

According to another aspect, the hierarchical material properties definition gives an easy visual representation and organization of ever increasing numbers of material properties definition. This technique can reduce redundancy and makes the material properties definition more manageable.

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

To facilitate the description of the present invention, it deems necessary to provide definitions for some terms that will be used throughout the disclosure herein. It should be noted that the definitions following are to facilitate the understanding and describe the present invention according to an embodiment. The definitions may appear to include some limitations with respect to the embodiment, the actual meaning of the terms has applicability well beyond such embodiment, which can be appreciated by those skilled in the art:

FEA stands for Finite Element Analysis.

Implicit FEA refers to $Ku=F$, where $K$ is the effective stiffness matrix, $u$ is the unknown displacement array and $F$ is the effective loads array. $F$ is a right hand side loads array while $K$ is a left hand side stiffness matrix. The solution is performed at the global level with a factorization of the effective stiffness matrix, which is function of the stiffness, mass and damping. One exemplary solution method is the Newmark integration scheme.

Explicit FEA refers to $Ma=F$, where $M$ is the diagonal mass array, $a$ is the unknown nodal acceleration array and $F$ is the effective loads array. The solution can be carried out at element level without factorization of a matrix. One exemplary solution method is called the central difference method.

Material properties include density, Young's modulus, shear coefficients, torsion constant, and Poisson's ratio. The details of material properties can be found in a book titled: "Mechanics of Materials, $4^{th}$ edition" by Timoshenko and Gere, published by PWS-KENT Publishing, 1997, which is incorporated herein by reference in its entirety.

Embodiments of the present invention are discussed herein with reference to FIGS. 1-5. However, those skilled in the art will readily appreciate that the detailed description given herein with respect to these figures is for explanatory purposes as the invention extends beyond these limited embodiments.

Referring now to the drawings, in which like numerals refer to like parts throughout several views. The present invention may be implemented using hardware, software or a combination thereof and may be implemented in a computer system or other processing system. In fact, in one embodiment, the invention is directed towards one or more computer systems that can carry out the functionality described herein. An example of a computer system 100 is shown in FIG. 1. The computer system 100 includes one or more processors, such as processor 104. The processor 104 is connected to a computer system internal communication bus 102. Various software embodiments are described in terms of this exemplary computer system. After reading this description, it will become apparent to a person skilled in the relevant art(s) how to implement the invention using other computer systems and/or computer architectures.

Computer system 100 also includes a main memory 108, preferably random access memory (RAM), and may also include a secondary memory 110. The secondary memory 110 may include, for example, one or more hard disk drives 112 and/or one or more removable storage drives 114, representing a floppy disk drive, a magnetic tape drive, an optical disk drive, etc. The removable storage drive 114 reads from and/or writes to a removable storage unit 118 in a well-known manner. Removable storage unit 118, represents a floppy disk, magnetic tape, optical disk, etc. which is read by and written to by removable storage drive 114. As will be appreciated, the removable storage unit 118 includes a computer usable storage medium having stored therein computer software and/or data.

In alternative embodiments, secondary memory 110 may include other similar means for allowing computer programs or other instructions to be loaded into computer system 100. Such means may include, for example, a removable storage unit 122 and an interface 120. Examples of such may include a program cartridge and cartridge interface (such as that found in video game devices), a removable memory chip (such as an EPROM, or PROM) and associated socket, and other removable storage units 122 and interfaces 120 which allow software and data to be transferred from the removable storage unit 122 to computer system 100. In general, Computer system 100 is controlled and coordinated by operating system (OS) software, which performs tasks such as process scheduling, memory management, networking and I/O services.

There may also be a communications interface 124 connecting to the bus 106. Communications interface 124 allows software and data to be transferred between computer system 100 and external devices. Examples of communications interface 124 may include a modem, a network interface (such as an Ethernet card), a communications port, a PCMCIA slot and card, etc. Software and data transferred via communications interface 124 are in the form of signals 128 which may be electronic, electromagnetic, optical, or other signals capable of being received by communications interface 124. These signals 128 are provided to communications interface 124 via a communications path (i.e., channel) 126. This channel 126 carries signals (or data flows) 128 and may be implemented using wire or cable, fiber optics, a phone line, a cellular phone link, an RF link and other communications channels.

The channel 126 facilitates a data flow 128 between a data network and the computer 100 and typically executes a special set of rules (i.e., a protocol) to send data back and forth. One of the common protocols is TCP/IP (Transmission Control Protocol/Internet Protocol) commonly used in the Internet. In general, the communication interface 124 manages the assembling of a data file into smaller packets that are transmitted over the data network or reassembles received packets into the original data file. In addition, the communication interface 124 handles the address part of each packet so that it gets to the right destination or intercepts packets destined for the computer 100.

In this document, the terms "computer program medium" and "computer usable medium" are used to generally refer to media such as removable storage drive 114, a hard disk installed in hard disk drive 112, and signals 128. These computer program products are means for providing software to computer system 100. The invention is directed to such computer program products.

The computer system 100 may also include an I/O interface 130, which provides the computer system 100 to access monitor, keyboard, mouse, printer, scanner, plotter, and a like.

Computer programs (also called computer control logic) are stored as application modules 106 in main memory 108 and/or secondary memory 110. Computer programs may also be received via communications interface 124. Such computer programs, when executed, enable the computer system 100 to perform the features of the present invention as discussed herein. In particular, the computer programs, when executed, enable the processor 104 to perform the features of the present invention. Accordingly, such computer programs represent controllers of the computer system 100.

In an embodiment where the invention is implemented using software, the software may be stored in a computer program product and loaded into computer system 100 using removable storage drive 114, hard drive 112, or communications interface 124. The application module 106, when executed by the processor 104, causes the processor 104 to perform the functions of the invention as described herein.

In another embodiment, the present invention is implemented primarily in hardware using, for example, hardware components such as application specific integrated circuits (ASICs). Implementation of the hardware state machine so as to perform the functions described herein will be apparent to persons skilled in the relevant art(s). In yet another embodiment, the present invention is implemented using a combination of both hardware and software.

The main memory 108 may be loaded with one or more application modules 106 that can be executed by one or more processors 104 with or without a user input through the I/O interface 130 to achieve desired tasks. In operation, when at least one processor 104 executes one of the application modules 106, the results are computed and stored in the secondary memory 110 (i.e., hard disk drive 112). The status of the finite element model definition (e.g., the hierarchical tree representation) is reported to the user via the I/O interface 130 either as a list or a graph.

In one embodiment, an application module is configured to facilitate a hierarchical material properties definition. As a new material type is created, the material type is checked if it is a root material. If so, the material properties explicitly defined are read and stored in the finite element mode. Otherwise, the parent material type is located, and the material properties of the parent is read and stored as the base material properties of the current created material type. Any additional definition will be either overwrite or add to the base material properties. One exemplary implementation of this technique is included in a well-known engineering computer program product, LS-DYNA®, offered by Livermore Software Technology Corporation.

Figure 2A:
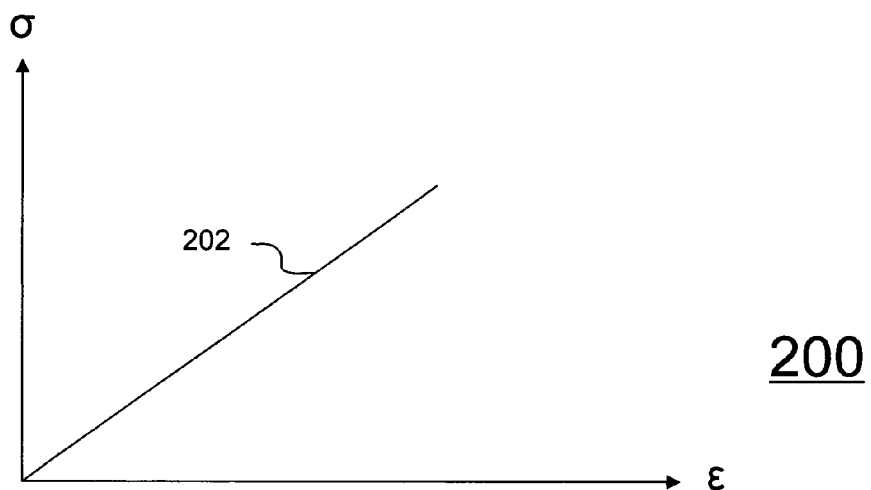
FIGS. 2A and 2B show a couple of exemplary material property curves in accordance with one embodiment of the present invention.
Figure 2B:
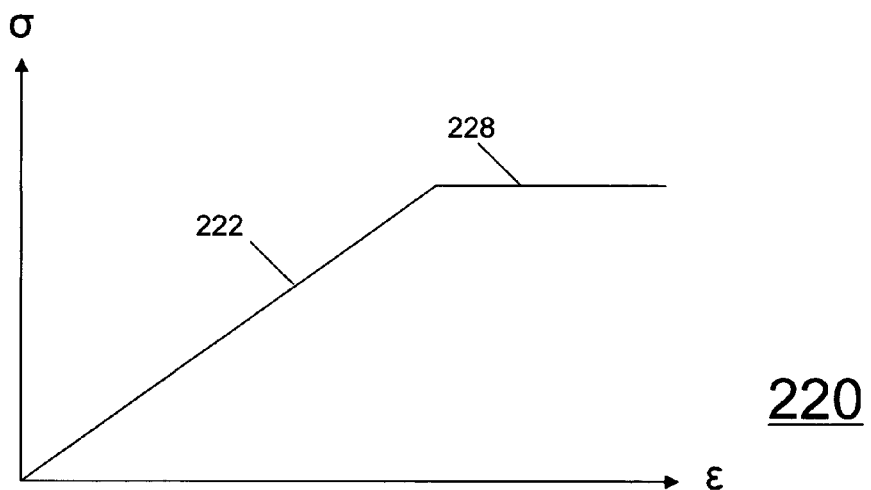

FIGS. 2A and 2B show a couple exemplary material property curves 200 and 220 in accordance with one embodiment of the present invention. Most structural materials have an initial region on the strain-stress ($\epsilon$-$\sigma$) curve in which the material behaves both elastically and linearly. Such linear relationship in an elastic material is called linearly elastic. This is extremely important property of many solid materials, including most metals, plastics, wood, concrete, and ceramics. In this embodiment, the curve 200 defines a linearly elastic material, which shows a linear relationship 202 between strain ($\epsilon$) and stress ($\sigma$). The slope of the line 202 is Young's modulus (E) based on Hooke's law ($\sigma = E\epsilon$). Since the majority of the materials behaves linearly elastic initially, the curve 200 is one of the most basic and common material property used in a finite element analysis of a structure. FIG. 2B shows another exemplary strain-stress curve 220, in which there are two different slopes for the relationship between strain ($\epsilon$) and stress ($\sigma$): a linearly elastic one 222 based on Hooke's law initially and a horizontal line 228 representing pure plastic beyond the yield stress of the material. The elastic-plastic curve 220 is used in many non-linear finite element analysis of a structure. In order to simplify the figures in this specification, only two examples are shown herein to demonstrate strain-stress relationship of structural material property, many other different material properties may be defined in another embodiment.

FIG. 3 shows an exemplary text view of a hierarchical material definition 300 used in finite element analysis software in accordance with one embodiment of the present invention. In this embodiment, the hierarchical material definition 300 includes a plurality of material definitions, 302, 308, 310 and 312. Each of the material definitions except the root material has a parent. The material properties of the parent are inherited by the child. In other words, the material properties of the parent are read and stored as the base properties of the child if the material is not a root. Then the explicitly defined properties of the child either overwrite or add to the base properties. The material definition 302 is a root material, which is indicated by a number "0" 304. The material properties of a root material are explicitly defined. For example, Young's modulus E 305, material density RHO 306 and Poisson's ratio NU 307 are defined explicitly in definition 302 in one embodiment. In another embodiment, the material definition 308 of a child is very simpler, because most of the properties have been defined in the parent. In this case, the root material 302 is the parent of the material definition 308. The explicit defined properties in the child material definition 308 are the yield stress SIGY 309.

Figure 4:
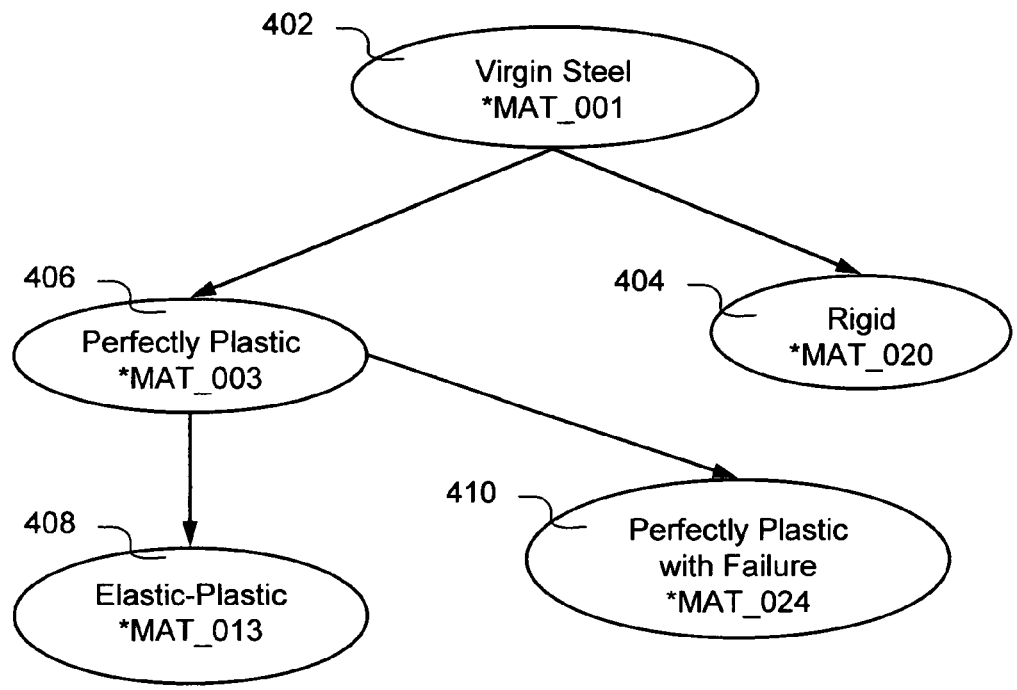
FIG. 4 shows a graphical view of a hierarchical tree of a plurality of material definitions in accordance with one embodiment of the present invention.

FIG. 4 shows a graphical view of a hierarchical tree 400 of a plurality of material definitions in accordance with one embodiment of the present invention. Based upon the rules of the hierarchical material definition, material properties of the immediate parent are inherited by the child. In this embodiment, a root material definition, "Virgin Steel *MAT__001" 402, is located on the top of the hierarchical tree 400. Under the root material definition 402, there are a number of other material definitions. Material definitions, "Perfect Plastic *MAT-003" 404, and "Rigid *MAT__020" 406, share the same parent, the root material definition 402. Material definition "Perfect Plastic *MAT-003" 404 has two children: material definitions "Elastic-Plastic *MAT__013" 408 and "Perfect Plastic with Failure *MAT__024" 410. The graphical representation of the hierarchical material definition makes it very easy for user to recognize the relationship between each of the material definitions in a particular finite element model. It is very easy to create a new material definition by selecting a parent material to inherit all of the material properties already defined.

Figure 5:
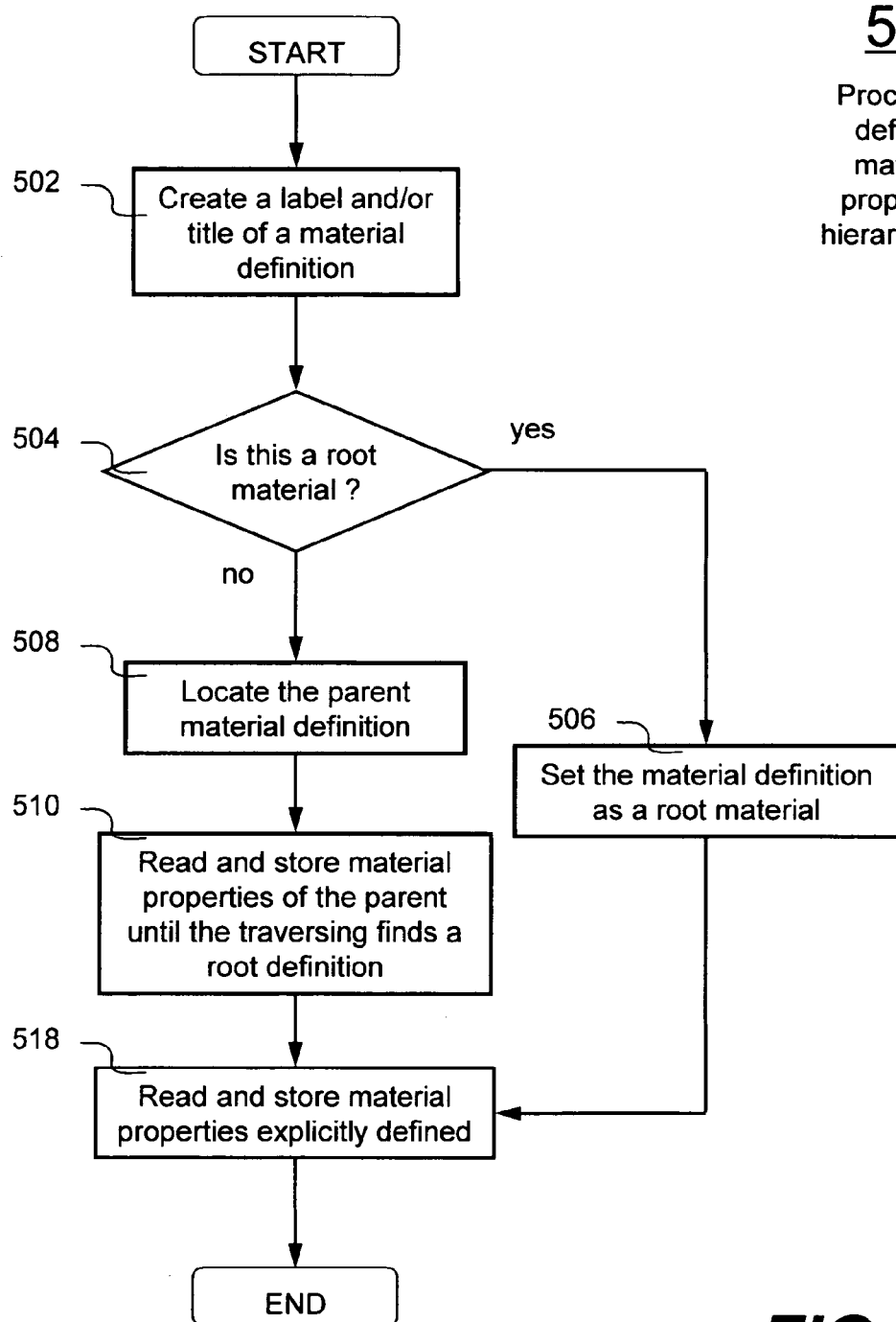
FIG. 5 shows a flowchart or process of defining material properties hierarchically in accordance with one embodiment of the present invention.

FIG. 5 shows a flowchart or process 500 of defining material properties hierarchically in accordance with one embodiment of the present invention. The process 500, which is preferably understood in conjunction with the previous figures, may be implemented in software, hardware, or a combination of both. In this embodiment, the process 500 starts by creating a label or title of a new material at 502. The process 500 moves to a test 504, in which the new material is determined to be set as a root or not. If the new material is to set as a root material, the process 500 follows the yes branch to 506, in which the new material is set to be a root type. The explicitly defined material properties are read and stored as the properties of this new material at 518 before process 500 ends. If the test 504 is not true, the process 500 follows the no branch to 508, in which a parent material is located. At 510, the process 500 reads and stores the material properties of the parent as the base properties of the new material. Then the process 500 reads the explicitly defined properties for the new material to either overwrite or add to the base properties at 518. Finally, the process 500 ends.

Although an exemplary embodiment of invention has been disclosed, it will be apparent to those skilled in the art that various changes and modifications may be made to achieve the advantage of the invention. It will be obvious to those skilled in the art that some components may be substituted with another component providing same function. The appended claims cover the present invention.

What is claimed is:

1. A computer-implemented method of defining material properties hierarchically in finite element analysis of a structure represented by a plurality of finite elements, the method comprising:

receiving at least one set of material property definitions to be used in a finite element analysis of the structure in a computer with a finite element analysis application module installed thereon;

converting each of the at least one set of material property definitions to a new material type in a hierarchical relationship of material types stored in the computer, wherein the new material type is configured for being assigned to one or more of the finite elements;

when said each of the at least one set of material property definitions is defined as a root material type, assigning the new material type to the root of the hierarchical relationship; reading and storing explicitly defined properties in said each of the at least one set of material property definitions as the material properties of the new material type;

otherwise when said each of the at least one set of material property definitions is not defined as a root material type, locating a parent of the new material type from the hierarchical relationship; assigning the new material type as a child of the parent in the hierarchical relationship; inheriting or including material properties of the parent as the material properties of the new material type; reading and storing explicitly defined properties in said each of the at least one set of material property definitions to update the material properties of the new material type thereafter; and displaying, in a monitor coupled to the computer, a graphical representation of the hierarchical relationship as desired, wherein the graphical representation of the hierarchical relationship is configured for assisting users of the finite element analysis to efficiently create a finite element analysis model.

2. The computer-implemented method of claim 1, further comprising creating a label for the new material type to be defined.

3. The computer-implemented method of claim 2, wherein the label is an alphanumerical label.

4. The computer-implemented method of claim 2, wherein the label is a title.

5. The computer-implemented method of claim 2, wherein the material properties of the new material type include Young's modulus, density, Poisson's ratio.

6. The computer-implemented method of claim 2, wherein the label is zero for the root.

7. The computer-implemented method of claim 2, wherein said locating the parent is through the label of the parent.

8. The computer-implemented method of claim 1, wherein the root is located on top of the hierarchical relationship.

9. The computer-implemented method of claim 1, said locating the parent further comprises traversing the hierarchical relationship until the root is found.

10. A computer recordable storage medium containing instructions for controlling a computer for defining material properties hierarchically in finite element analysis of a structure represented by a plurality of finite elements by a method comprising:

receiving at least one set of material property definitions to be used in a finite element analysis of the structure in the computer;

converting each of the at least one set of material property definitions to a new material type in a hierarchical relationship of material types stored in the computer, wherein the new material type is configured for being assigned to one or more of the finite elements;

when said each of the at least one set of material property definitions is defined as a root material type, assigning the new material type to the root of the hierarchical relationship; reading and storing explicitly defined properties in said each of the at least one set of material property definitions as the material properties of the new material type;

otherwise when said each of the at least one set of material property definitions is not defined as a root material type, locating a parent of the new material type from the hierarchical relationship; assigning the new material type as a child of the parent in the hierarchical relationship; inheriting or including material properties of the parent as the material properties of the new material type; reading and storing explicitly defined properties in said each of the at least one set of material property definitions to update the material properties of the new material type; and displaying, in a monitor coupled to the computer, a graphical representation of the hierarchical relationship as desired, wherein the graphical representation of the hierarchical relationship is configured for assisting users of the finite element analysis to efficiently create a finite element analysis model.

11. The computer recordable storage medium of claim 10, wherein said method further comprises creating a label for the new material type to be defined.

12. The computer recordable storage medium of claim 10, wherein the root is located on top of the hierarchical relationship.

13. The computer recordable storage medium of claim 10, wherein said locating the parent further comprises traversing the hierarchical relationship until the root is found.

14. A system for defining material properties hierarchically in finite element analysis of a structure represented by a plurality of finite elements, the system comprising:

an I/O interface;
a communication interface;
a secondary memory;
a main memory for storing computer readable code for an application module;
at least one processor coupled to the main memory, the secondary memory, the I/O interface, and the communication interface, said at least one processor executing the computer readable code in the main memory to cause the application module to perform operations of:
receiving at least one set of material property definitions to be used in a finite element analysis of the structure;
converting each of the at least one set of material property definitions to a new material type in a hierarchical relationship of material types stored in the main memory, wherein the new material type is configured for being assigned to one or more of the finite elements;

when said each of the at least one set of material property definitions is defined as a root material type, assigning the new material type to the root of the hierarchical relationship; and reading and storing explicitly defined properties in said each of the at least one set of material property definitions as the material properties of the new material type;

otherwise when said each of the at least one set of material property definitions is not defined as a root material type, locating a parent of the new material type from the hierarchical relationship;

assigning the new material type as a child of the parent in the hierarchical relationship;

inheriting or including material properties of the parent as the material properties of the new material type; and reading and storing explicitly defined properties in said each of the at least one set of material property definitions to update the material properties of the new material type therefore; and displaying, in a monitor coupled to the system, a graphical representation of the hierarchical relationship of material types as desired, wherein the graphical representation of the hierarchical relationship is configured for assisting users of the finite element analysis to efficiently create a finite element analysis model.

15. The system of claim 14, further comprising operations of creating a label for the new material type to be defined.

16. The system of claim 14, wherein the root is located on top of the hierarchical relationship.

17. The system of claim 14, wherein said locating the parent further comprises traversing the hierarchical relationship until the root is found.

* * * * *